(12) United States Patent
Beatson (10) Patent No.: US 7,160,797 B2
(45) Date of Patent: Jan. 9, 2007

(54) METHOD OF BUMPING DIE PADS FOR WAFER TESTING

(75) Inventor: David T. Beatson, Kennett Square, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 11/121,703

(22) Filed: May 3, 2005

(65) Prior Publication Data

US 2005/0253140 A1   Nov. 17, 2005

Related U.S. Application Data

(60) Provisional application No. 60/570,860, filed on May 12, 2004.

(51) Int. Cl.
*H01L 21/44* (2006.01)
(52) U.S. Cl. .................. 438/617; 438/15; 438/612; 438/613; 257/737; 257/E23.021
(58) Field of Classification Search ............ 438/15, 438/617, 612, 613; 257/737, E23.021
See application file for complete search history.

(56) References Cited

U.S. PATENT DOCUMENTS

| 3,627,192 | A | * | 12/1971 | Killingsworth | ............ | 228/54 |
|---|---|---|---|---|---|---|
| 5,249,450 | A | | 10/1993 | Wood et al. | | |
| 5,838,160 | A | | 11/1998 | Beaman et al. | | |
| 5,929,521 | A | * | 7/1999 | Wark et al. | .............. | 257/737 |
| 6,605,480 | B1 | * | 8/2003 | Liu et al. | ............. | 438/14 |
| 2002/0084794 | A1 | * | 7/2002 | Root | ................. | 324/754 |
| 2003/0071319 | A1 | * | 4/2003 | Stierman et al. | ........... | 257/459 |
| 2003/0143797 | A1 | | 7/2003 | Paik et al. | | |
| 2005/0133571 | A1 | * | 6/2005 | Chuang | .............. | 228/180.5 |

OTHER PUBLICATIONS

Semiconductor Fabrication. Oct. 5, 2006. http://en.wikipedia.org/wiki/Semiconductor_Fabrication.

* cited by examiner

*Primary Examiner*—Michelle Estrada
*Assistant Examiner*—Nicholas J. Tobergte
(74) *Attorney, Agent, or Firm*—Christopher M. Spletzer, Sr.

(57) ABSTRACT

A method of processing a semiconductor wafer including a plurality of semiconductor dies is provided. The method includes providing a semiconductor wafer including a plurality of semiconductor dies, at least a portion of the semiconductor dies including contact pads for testing the respective semiconductor die. The method also includes positioning conductive bumps on the contact pads prior to completing wafer testing of the semiconductor wafer and prior to the singulation of the plurality of semiconductor dies from the semiconductor wafer. At least a portion of the conductive bumps are configured to be electrical paths during wafer testing of the semiconductor wafer.

18 Claims, 6 Drawing Sheets

METHOD OF BUMPING DIE PADS FOR WAFER TESTING

CROSS-REFERENCES TO RELATED APPLICATIONS

The present application is related to and claims priority from U.S. Provisional Application Ser. No. 60/570,860, filed May 12, 2004, which is incorporated herein by reference in its entirety.

FIELD OF THE INVENTION

The present invention relates to techniques for preparing semiconductor dies on a semiconductor wafer for wafer testing, and more particularly, to bumping contact pads on a semiconductor die prior to singulation from the semiconductor wafer.

BACKGROUND OF THE INVENTION

In the testing of integrated circuits, semiconductor dies or chips are typically tested in wafer form, prior to singulation from the wafer. This testing is often referred to as "wafer testing" or "wafer test." This is in contrast to, for example, the testing of packaged integrated circuits after singulation and packaging, often referred to as "package testing" or "package test."

In wafer testing, the semiconductor dies includes contact pads for probing by probes electrically connected to a testing system. Oftentimes, the contact pads are probed multiple times during testing of the wafer to ensure proper contact has been made, particularly in cases where fusing is used in the testing process (e.g., in dynamic random access memory, that is DRAM, devices). The contact pad on the die may not be able to withstand the repetitive probing without sustaining some level of damage or scarring. For example, the contact pad may be damaged so that it is difficult if not impossible to wire bond to the contact pad after singulation from the semiconductor wafer, thereby reducing yield and slowing the wirebonding process. In flip chip applications, the repetitive probing may also reduce yield. Further, the pad may be damaged so that the testing of the semiconductor die is inconclusive as to the viability of the semiconductor die, thereby further reducing yield.

Thus, it would be desirable to provide an apparatus and method for preparing semiconductor dies for wafer test that overcomes one or more of the above-recited deficiencies.

BRIEF SUMMARY OF THE INVENTION

According to an exemplary embodiment of the present invention, a method of processing a semiconductor wafer including a plurality of semiconductor dies is provided. The method includes providing a semiconductor wafer including a plurality of semiconductor dies, at least a portion of the semiconductor dies including contact pads for testing the respective semiconductor die. The method also includes positioning conductive bumps on the contact pads prior to completing wafer testing of the semiconductor wafer and prior to the singulation of the plurality of semiconductor dies from the semiconductor wafer. At least a portion of the conductive bumps are configured to be electrical paths during wafer testing of the semiconductor wafer.

According to another exemplary embodiment of the present invention, a semiconductor wafer configured to be wafer tested is provided. The semiconductor wafer includes a plurality of semiconductor dies, at least a portion of the plurality of semiconductor dies including contact pads for testing the respective semiconductor die. The semiconductor wafer also includes a plurality of conductive bumps positioned on at least a portion of the contact pads, the conductive bumps being configured to be in electrical contact with probing elements during wafer testing of the semiconductor wafer.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

As used herein, the term conductive bump is intended to refer to any conductive material applied to the contact pads of semiconductor dies of a semiconductor wafer prior to the completion of wafer testing and singulation.

As used herein, the term semiconductor dies is intended to refer to a portion of a semiconductor wafer after singulation and is intended to cover both semiconductor dies and chips.

As used herein, the term "contact pad" is intended to refer to any conductive contact location on the device on which it is included. For example, a contact pad on a semiconductor die relates to any conductive contact location on the semiconductor device, irrespective of its shape, size, etc.

According to an exemplary embodiment of the present invention, stud bumps are formed on contact pads of the semiconductor wafer prior to wafer test probing, thus allowing a higher first pass sort yield, lower cost probing technology, and improving long term reliability through the elimination of the probe "scar", which interferes with the intermetallic formation between (1) a bonding wire and the bond/contact pad or (2) a flip chip bump/ball and the bond/contact pad. Further, as described below, during the wirebonding interconnect process, looping speed can be improved because of the previous placement of the stud bump on the contact pad of the semiconductor wafer. The bump presence enables a looping technique, known as standoff stitch bond, to be performed much more rapidly, therefore improving assembly costs.

Figure 1A:
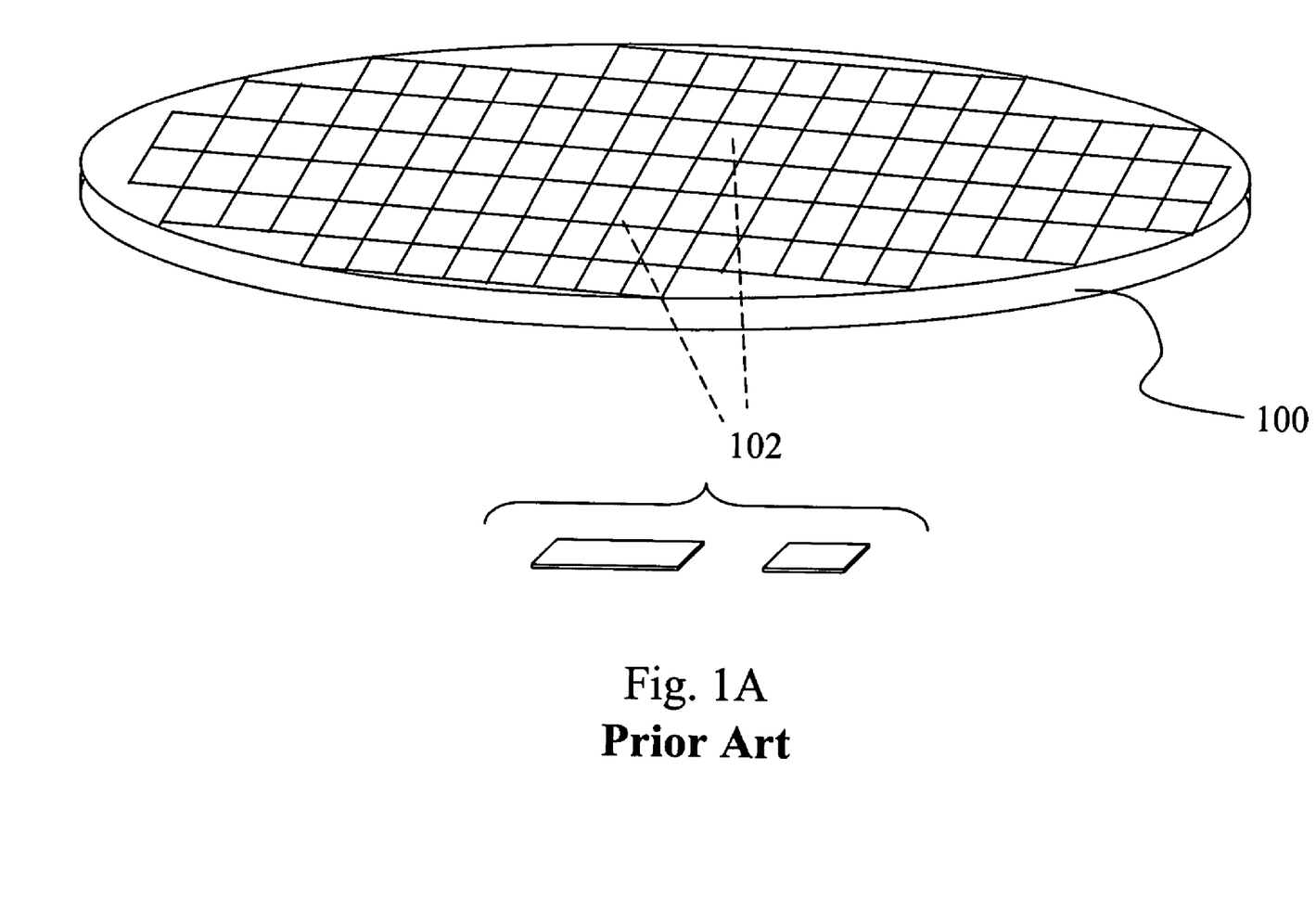
FIG. 1A is a perspective view of a conventional semiconductor wafer including a plurality of semiconductor dies prior to singulation.

FIG. 1A illustrates semiconductor wafer 100 including a plurality of semiconductor dies 102 prior to singulation. As made clear by the detailed view of the two exemplary semiconductor dies 102 in FIG. 1A, the semiconductor dies 102 are not limited to any particular design or configuration. During wafer testing of semiconductor wafer 100, probe elements in electrical communication with a testing system make electrical contact with contact pads on the semiconductor dies 102.

Figure 1B:
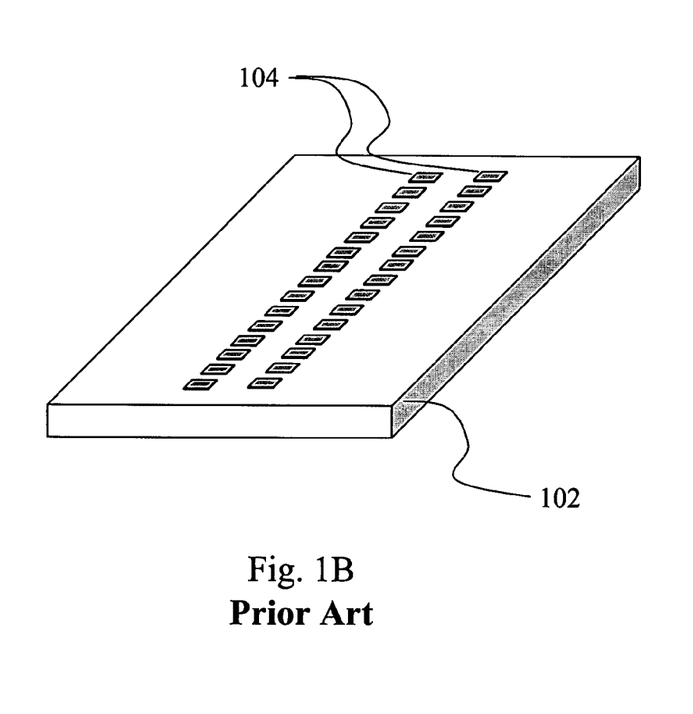
FIG. 1B is a perspective view of a conventional semiconductor die which is part of a semiconductor wafer similar to that illustrated in FIG. 1A.

FIG. 1B illustrates an exemplary semiconductor die 102 including two rows of contacts pads 104. For example, such a configuration of contact pads 104 on a semiconductor die 102 is typical for a DRAM memory die.

Figure 1C:
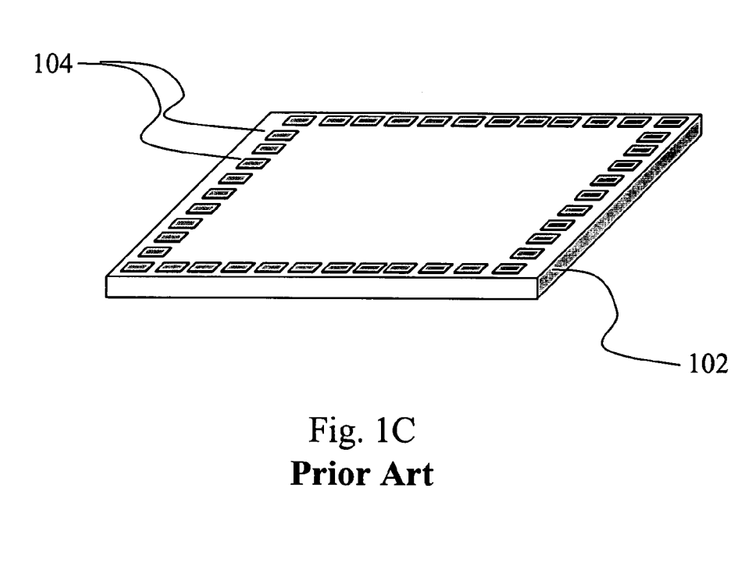
FIG. 1C is a perspective view of another conventional semiconductor die which is part of a semiconductor wafer similar to that illustrated in FIG. 1A.

FIG. 1C illustrates another exemplary semiconductor die 102 including contacts pads 104 disposed about the periphery of semiconductor die 102. For example, such a configuration of contact pads 104 on a semiconductor die 102 is typical for a Flash memory die and other standard semiconductor dies.

The arrangement of contact pads 104 on the semiconductor dies 102 illustrated in FIGS. 1B–1C are exemplary in nature, and as such, the present invention is not limited thereto.

Figure 2:
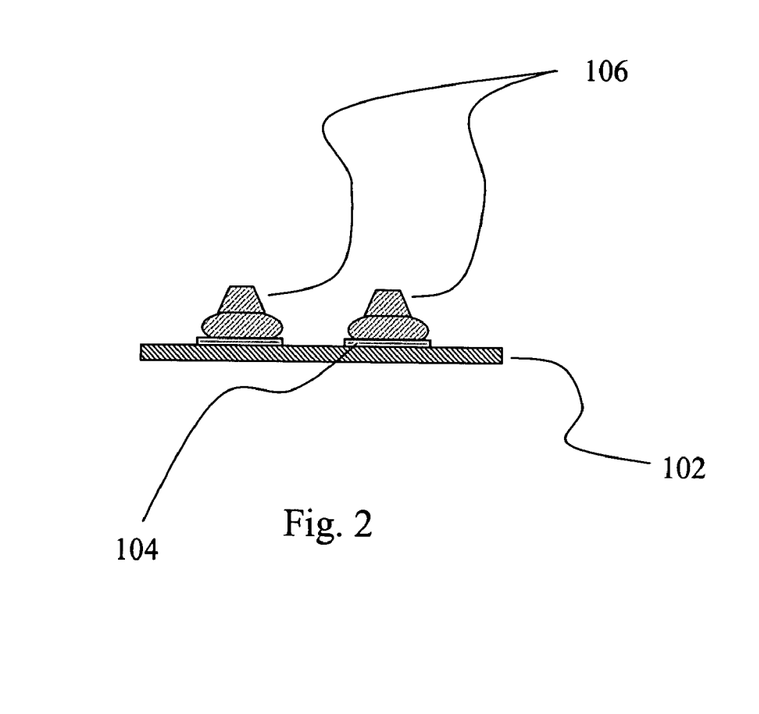
FIG. 2 is a side view of a semiconductor die including conductive bumps formed on the contact pads of the semiconductor die in accordance with an exemplary embodiment of the present invention.

FIG. 2 illustrates a semiconductor die 102 including contact pads 104 in a side by side (i.e., two row) configuration such as that illustrated in FIG. 1B. Conductive bumps 106 are provided on contact pads 104 for use in wafer testing of the semiconductor wafer including the semiconductor die 102.

Figure 3:
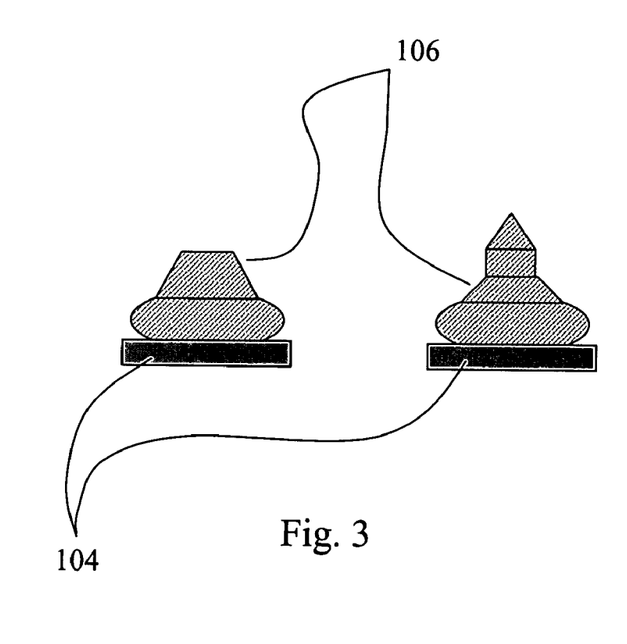
FIG. 3 is a side view of two conductive bumps with two exemplary shapes formed on contact pads of a semiconductor die in accordance with an exemplary embodiment of the present invention.

FIG. 3 illustrates two exemplary conductive bump shapes 106 formed on contact pads 104 of a semiconductor die included as a part of a semiconductor wafer (the die and wafer are omitted from FIG. 3). The shapes of the conductive bumps 106 illustrated in FIG. 3 are exemplary in nature, and the present invention is not limited thereto.

According to an exemplary embodiment of the present invention, the conductive bumps are bump bonded on the contact pads using a wire bonding system including a wire bonding tool (e.g., a capillary).

Figure 4A:
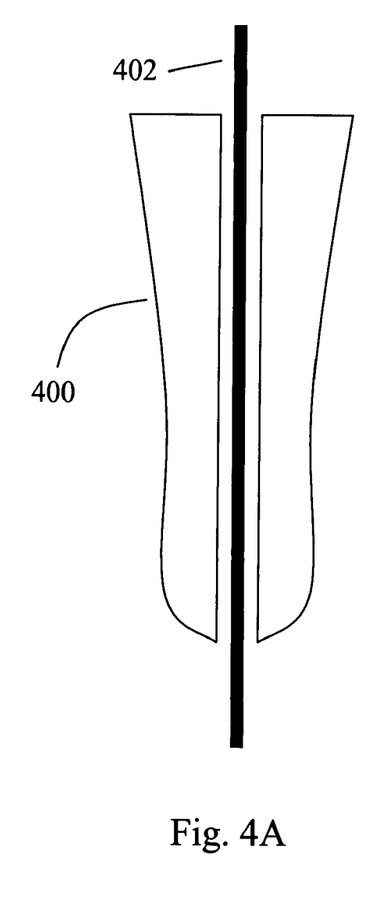
FIGS. 4A–4E are cut-away views of a wire bonding tool forming a conductive bump on a contact pad of a semiconductor die in accordance with an exemplary embodiment of the present invention.

FIGS. 4A–4E illustrate an exemplary process for forming a conductive bump using a wire bonding tool. FIG. 4A is a cut-away view of wire bonding tool 400 through which a conductive wire 402 extends. The exact design of the wire bonding tool 400 is not critical to the present invention, and as such, a simplified wire bonding tool 400 is illustrated in FIGS. 4A–4E. Thus, it is clear that certain features of the illustrated wire bonding tool (e.g., the configuration of the working tip of the tool, the configuration of the passage defined through the wire bonding tool) have been simplified, and the present invention is not limited thereto.

Figure 4B:
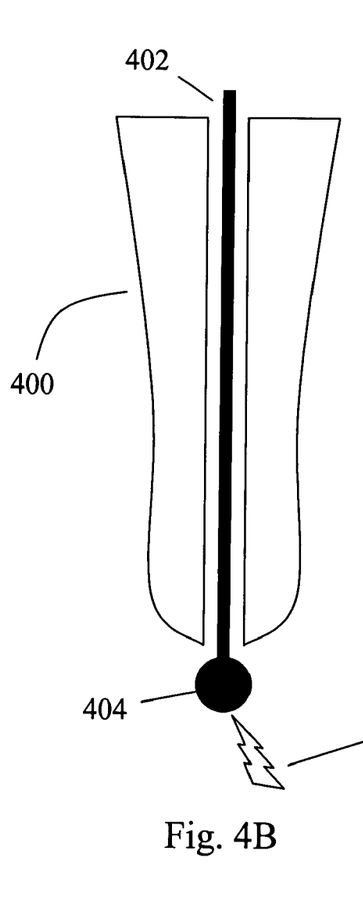
Figure 4C:
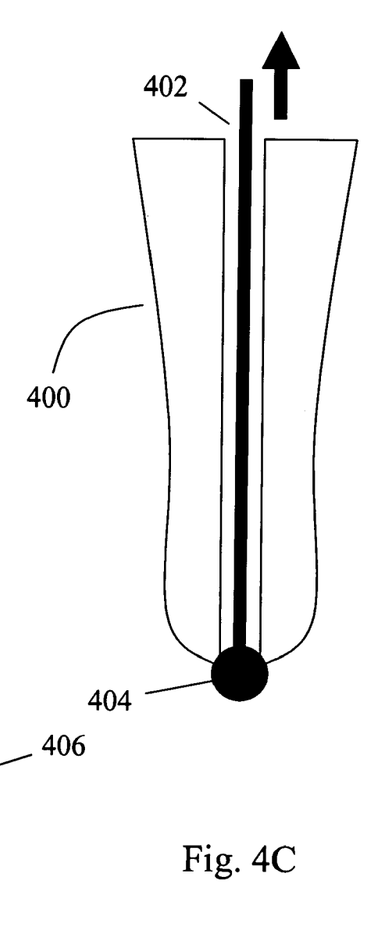
Figure 4D:
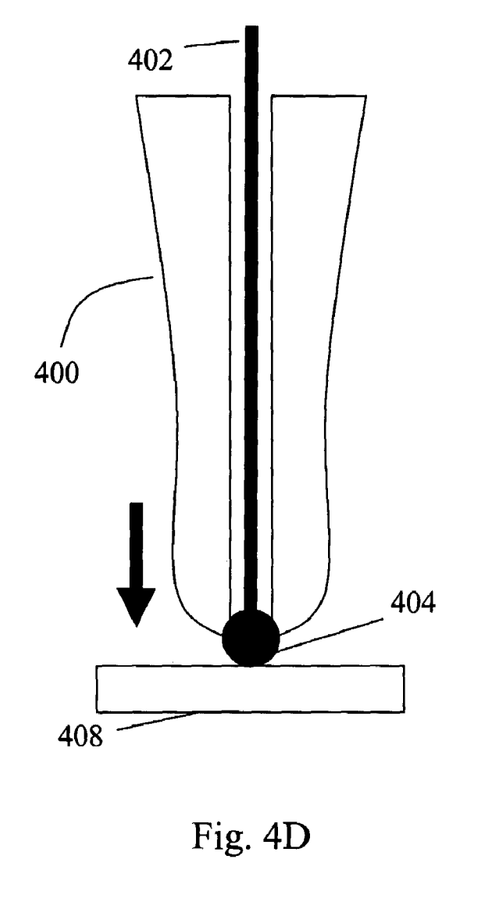
Figure 4E:
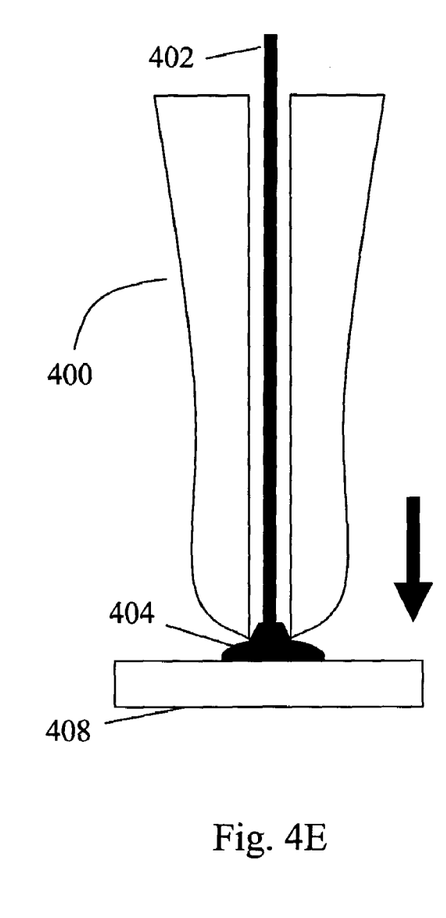

In FIG. 4B, energy 406 (e.g., provided by an electronic flame-off wand) is provided to form a free air ball 404 at an end of conductive wire 402. At FIG. 4C, the conductive wire 402 is raised such that free air ball 404 is partially within the tip of wire bonding tool 400. At FIG. 4D, wire bonding tool 400 is lowered towards a contact pad 408 of a semiconductor die (the semiconductor die and wafer are not shown in FIG. 4D), and at FIG. 4E, the wire bonding tool is further lowered such that free air ball 404 is formed into a desirably shaped conductive bump. While bonding free air ball to contact pad 40 as shown in FIGS. 4D–4E, the surface of contact pad 408 may be "scrubbed" by the tip of wire bonding tool 400 to remove oxidation and other contaminants. After the free air ball is formed into a desirably shaped conductive bump as shown in FIG. 4E, conductive wire 402 may be cut or otherwise separated from free air ball 404.

Although FIGS. 2–3 and 4D–4E illustrate conductive bumps formed on contact pads (with or without the semiconductor die being illustrated), according to the present invention, conductive bumps are formed on contact pads of semiconductor dies prior to singulation of the dies from a semiconductor wafer.

Figure 5:
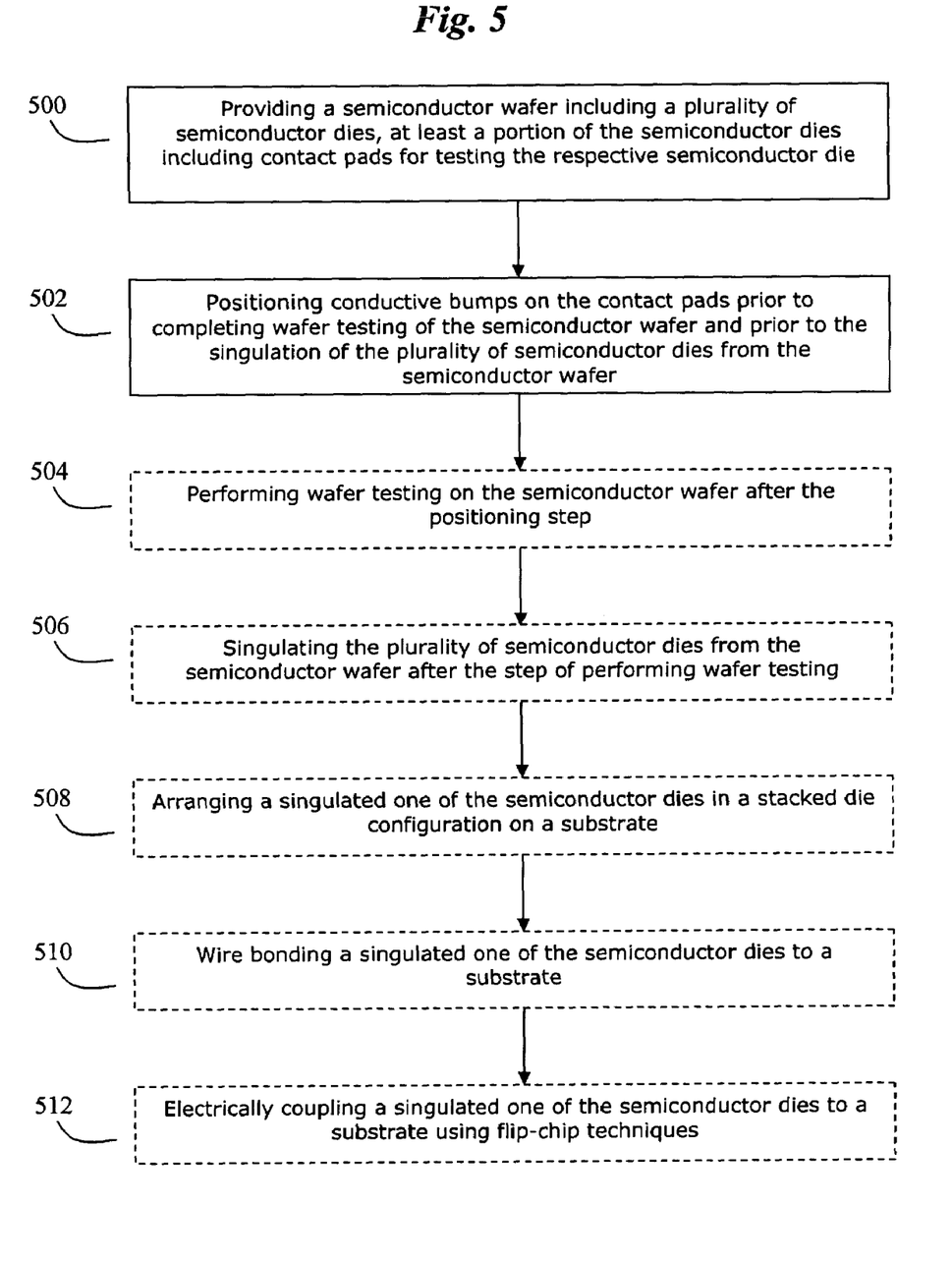
FIG. 5 is a flow diagram illustrating a method of preparing a semiconductor wafer for testing thereof in accordance with an exemplary embodiment of the present invention.

FIG. 5 is a flow diagram illustrating a method of processing a semiconductor wafer in accordance with an exemplary embodiment of the present invention. As detailed below, certain of the steps illustrated in FIG. 5 are optional (as marked by dotted lines), and various combinations of the optional steps may be included in the method of processing a semiconductor wafer. At step 500, a semiconductor wafer including a plurality of semiconductor dies is provided where at least a portion of the semiconductor dies include contact pads for testing the respective semiconductor die. At step 502, conductive bumps are positioned on the contact pads prior to completing wafer testing of the semiconductor wafer and prior to the singulation of the plurality of semiconductor dies from the semiconductor wafer. At least a portion of the conductive bumps are configured to be electrical paths during wafer testing of the semiconductor wafer.

For example, step 502 may include forming the conductive bumps on the contact pads. More specifically, step 502 may include bump bonding the conductive bumps on the contact pads. In such an embodiment, step 502 may further include (1) forming a free air ball at an end portion of a conductive wire, the conductive wire extending through a passage defined by a wire bonding tool, and (2) bump bonding the free air ball on one of the contact pads to form the conductive bump. Further still, step 502 may include scrubbing the contact pads with the wire bonding tool.

At optional step 504, wafer testing is performed on the semiconductor wafer after the positioning step. At optional step 506, the plurality of semiconductor dies are singulated from the semiconductor wafer after the step of performing wafer testing. At optional step 508, a singulated one of the semiconductor dies is arranged in a stacked die configuration on a substrate.

At optional step 510, a singulated one of the semiconductor dies is wire bonded to a substrate. For example, step 510 may include forming a first wire bond at a contact location on the substrate and forming a second wire bond at the conductive bump of the singulated one of the semiconductor dies.

At optional step 512, a singulated one of the semiconductor dies is electrically coupled to a substrate using flip-chip techniques, where the conductive bumps provide an electrical path in the flip-chip technique.

The semiconductor wafer of the present invention (including conductive bumps provided on the contact pads of the semiconductor dies) may be configured to be "probed" during wafer testing by a number of different probing systems. For example, the conductive bumps may be probed using pick and place probe elements, wire bonded probe elements, plated up probe elements, etc. Thus, the application of the present invention is not limited to any particular probing or testing system or technology.

One probing technology particularly suited to the present invention utilizes cantilever beam contact elements. Such contact elements may include a conductive post (a stand off for a cantilever beam), a cantilever beam coupled to the conductive post, and a tip structure coupled to the cantilever beam, where the tip structure is configured to probe the contact pads of the semiconductor dies of the wafer under test. According to the present invention, in certain applications the tip structure may be omitted from the cantilever beam contact elements because the conductive bump formed on the semiconductor die acts as an appropriate contact point for certain cantilever beams. Thus, certain issues related to the formation of the tip structure of a probe card (e.g., cost, manufacturing time, quality control) may be eliminated through the use of the present invention.

Conventional contact pads on semiconductor dies are typically a soft metal such as aluminum, while conventional probe tip structures tend to be a hard metal, and as such, damage to the soft contact pads tends to result from probing (particularly repetitive probing). As provided above, this repetitive probing may be employed to ensure that good contact is established. Such problems can be substantially reduced or even eliminated according to certain exemplary embodiments of the present invention. For example, the conductive bump formed on the contact pads of the semiconductor die may be gold, and the probe element (e.g., a cantilever beam) may be gold plated. Thus, a low corrosion, low resistance contact is provided between the probe element and the conductive bump. Thus, because of this low corrosion, low resistance contact, repetitive probing may be substantially reduced such that the yield from a semiconductor wafer is increased.

After the semiconductor wafers of the present invention are wafer tested, and then singulated into a plurality of semiconductor dies, a given semiconductor die may be wire bonded to a substrate. More specifically, contact pads on the semiconductor die may be electrically coupled by individual conductive wires to contact points on the substrate supporting the semiconductor die (e.g., a leadframe).

In one conventional wire bonding technique, a first wire bond (a first end of a wire loop) is formed on the contact pad of the semiconductor die, and then a second wire bond (a second end of the wire loop) is formed on a contact point of the substrate.

In a second and often preferred wire bonding technique (sometimes referred to as standoff stitch bonding), a bump is formed on the contact pad of the semiconductor die, and then a first wire bond is formed on a contact point of the substrate, and then a second wire bond is formed on the bump on the contact pad of the semiconductor die. This method is sometimes preferred because the bump provides a bonding location on the die that facilitates a low height wire bond. Further, this technique desirably provides a buffer (i.e., the bump) between the semiconductor die and the second bond, which may substantially minimize potential damage to the semiconductor die during second bond formation. Unfortunately, this second technique adds additional expense (e.g., cost of forming the bump) and time (e.g., the time to first form the bump prior to first bond formation) in contrast to the first conventional technique.

According to the present invention, the desired benefits of the second and often preferred conventional wire bonding technique may be enjoyed without the additional expense or time. This is because the conductive bump has already been formed on a contact point of the semiconductor die, and thus, there is minimal additional expense or time during the wire bonding operation. Thus, a cost effective and fast wire bonding operation is facilitated.

The benefits of the present invention in wire bonding of semiconductor dies to substrates are particularly realized in stacked die configurations. If the first conventional wire bonding technique is employed in a stacked die application, the substrate tends to be large because of looping constraints. Such a large substrate may be expensive and may occupy excessive real estate in use. If the second conventional wire bonding technique is employed in a stacked die application, the bump formed prior to first bond adds time and cost to the wire bonding process. By providing conductive bumps on the contact pads of the semiconductor dies prior to the completion of wafer testing and singulation, the desired benefits of the second conventional wire bonding technique may again be enjoyed without the additional expense or time.

In addition to the benefits described above regarding wire bonding technology, the present invention also provides benefits for flip-chip technology. As is well known in the art, certain manufacturers conductively couple semiconductor dies to substrate contacts by forming conductive balls or bumps on the contact pads of the semiconductor dies after wafer test has been completed. According to the present invention, the conductive bumps are desirably already formed on the semiconductor dies, and as such, they may be coupled to substrate contacts using, for example, thermosonic, thermocompressive, or solder reflow flip-chip techniques.

Although the present invention has been described primarily with respect to gold conductive bumps formed on contact pads of semiconductor dies through bump bonding using a wire bonding process, it is not limited thereto. Various other conductive materials (e.g., copper) may be used to form the conductive bump, and methods other than wire bonding may be employed to form the conductive bump on the contact pad.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of processing a semiconductor wafer including a plurality of semiconductor dies, the method comprising the steps of:
    providing a semiconductor wafer including a plurality of semiconductor dies, at least a portion of the semiconductor dies including contact pads for testing the respective semiconductor die; and
    bump bonding conductive bumps on the contact pads prior to completing wafer testing of the semiconductor wafer and prior to the singulation of the plurality of semiconductor dies from the semiconductor wafer, at least a portion of the conductive bumps being configured to be electrical paths during wafer testing of the semiconductor wafer.

2. The method of claim 1 wherein the bump bonding step includes bump bonding the conductive bumps on the contact parts using a wire bonding took.

3. The method of claim 1 wherein the bump bonding step comprises (1) forming a free air ball at an end portion of a conductive wire, the conductive wire extending through a passage defined by a wire bonding tool, and (2) bump bonding the free air ball on one of the contact pads to form the conductive bump.

4. The method of claim 3 wherein step (2). comprises scrubbing the contact pads with the wire bonding tool.

5. The method of claim 1 wherein the bump bonding step includes bump bonding gold conductive bumps on the contact pads.

6. The method of claim 1 further comprising the step of performing wafer testing on the semiconductor wafer after the bump bonding step.

7. The method of claim 6 further comprising the step of singulating the plurality of semiconductor dies from the semiconductor wafer after the step of performing wafer testing.

8. The method of claim 7 further comprising the step of wire bonding a singulated one of the semiconductor dies to a substrate, the step of wire bonding including forming a first wire bond at a contact location on the substrate and forming a second wire bond at the conductive bump of the singulated one of the semiconductor dies.

9. The method of claim 8 further comprising arranging the singulated one of the semiconductor dies in a stacked die configuration on the substrate before the step of wire bonding.

10. The method of claim 1 further comprising the step of electrically coupling a singulated one of the semiconductor dies to a substrate wherein the conductive bumps facilitate the electrical coupling.

11. The method of claim 10 wherein the step of electrically coupling includes electrically coupling the singulated one of the semiconductor dies to the substrate using flip-chip techniques.

12. The method of claim 1 wherein the bump bonding step includes bump bonding a material including gold to form the conductive bumps.

13. The method of claim 12 further comprising the step of probing the conductive bumps using probe elements including gold.

14. The method of claim 12 further comprising the step of probing the conductive bumps using probe elements including a gold plating.

15. The method of claim 3 wherein the bump bonding step further includes raising the free air ball such that the free air ball is at least partially within a tip of the wire bonding tool prior to step (2).

16. The method of claim 6 wherein the step of performing wafer testing includes contacting each of the conductive bumps with a cantilever beam probe element.

17. The method of claim 16 wherein the step of performing wafer testing includes contacting each of the conductive bumps with the cantilever beam probe element where the cantilever beam probe element does not include a tip portion configured to contact the conductive bumps.

18. The method of claim 1 wherein the bump bonding step includes bump bonding a material including copper to form the conductive bumps.

* * * * *

UNITED STATES PATENT AND TRADEMARK OFFICE
CERTIFICATE OF CORRECTION

PATENT NO. : 7,160,797 B2 Page 1 of 1
APPLICATION NO. : 11/121703
DATED : January 17, 2007
INVENTOR(S) : David T. Beatson It is certified that error appears in the above-identified patent and that said Letters Patent is hereby corrected as shown below:

At Column 6, line 59, "parts using a wire bonding took." should read --pads using a wire bonding tool--.

At Column 6, line 66, "4. The method of claim 3 wherein step (2). comprises" should read -- 4. The method of claim 3 wherein step (2) comprises--.

At Column 8, line 27, should be added -- 19. The method of claim 1 wherein the bump bonding step includes bump bonding the conductive bumps such that at least a portion of the conductive bumps defines a contact point configured for contact with a probe element during wafer testing.--.

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,160,797 B2 |
| APPLICATION NO. | : 11/121703 |
| DATED | : January 9, 2007 |
| INVENTOR(S) | : David T. Beatson |

It is certified that error appears in the above-identified patent and that said Letters Patent is hereby corrected as shown below:

At Column 6, line 59, "parts using a wire bonding took." should read --pads using a wire bonding tool--.

At Column 6, line 66, "4. The method of claim 3 wherein step (2). comprises" should read -- 4. The method of claim 3 wherein step (2) comprises--.

At Column 8, line 27, should be added -- 19. The method of claim 1 wherein the bump bonding step includes bump bonding the conductive bumps such that at least a portion of the conductive bumps defines a contact point configured for contact with a probe element during wafer testing.--.

This certificate supersedes Certificate of Correction issued March 6, 2007.

Signed and Sealed this

Twenty-seventh Day of March, 2007

JON W. DUDAS
*Director of the United States Patent and Trademark Office*